United States Patent
Hu et al.

(10) Patent No.: US 10,727,948 B2
(45) Date of Patent: Jul. 28, 2020

(54) COMMUNICATION SYSTEM EMPLOYING SURFACE-COUPLED OPTICAL DEVICES

(71) Applicant: Nokia Solutions and Networks OY, Espoo (FI)

(72) Inventors: Ting-Chen Hu, Westfield, NJ (US); Stefano Grillanda, Maplewood, NJ (US)

(73) Assignee: Nokia Solutions and Networks OY, Espoo (FI)

( * ) Notice: Subject to any disclaimer, the term of this patent is extended or adjusted under 35 U.S.C. 154(b) by 0 days.

(21) Appl. No.: 15/946,161

(22) Filed: Apr. 5, 2018

(65) Prior Publication Data

US 2019/0312644 A1 Oct. 10, 2019

(51) Int. Cl.
*H04B 10/00* (2013.01)
*H04B 10/27* (2013.01)
(Continued)

(52) U.S. Cl.
CPC .......... *H04B 10/27* (2013.01); *H01S 5/0224* (2013.01); *H01S 5/02248* (2013.01);
(Continued)

(58) Field of Classification Search
CPC  H04B 10/40; H04B 10/2504; H04B 10/2507; H04B 10/291; H04B 10/60;
(Continued)

(56) References Cited

U.S. PATENT DOCUMENTS 5,436,756 A  7/1995 Knox et al.
5,889,607 A  3/1999 Suzuki et al.
(Continued)

FOREIGN PATENT DOCUMENTS

EP   0821253 A2  1/1998
WO   2009144691 A1  3/2009

OTHER PUBLICATIONS

Earnshaw, M. P., "Optical Apparatus With Paired Input and Output Planar Waveguides Coupled to a Reflective Modulator," U.S. Appl. No. 15/445,099, filed Feb. 28, 2017, 56 pages.
(Continued)

*Primary Examiner* — Hanh Phan
(74) *Attorney, Agent, or Firm* — Mendelsohn Dunleavy, P.C.; Yuri Gruzdkov

(57) ABSTRACT

Optical transmitters, receivers, and transceivers implemented using a plurality of surface-coupled optical devices that can be manufactured on the same planar substrate and then post-processed to provide some of the devices with different respective partially transparent front mirrors compatible with and/or customized for different respective optical functions. When appropriately electrically biased and driven, different subsets of such devices can operate as lasers, optical modulators, optical amplifiers, and photodetectors, respectively. In this manner, an integrated array of such devices can be customized to provide the optical functions needed for the intended product. For example, an optical transmitter can be constructed using an integrated array that comprises three surface-coupled optical devices configured to operate as a laser, an optical modulator, and an optical amplifier, respectively. An optical receiver can be constructed using an integrated array that comprises two surface-coupled optical devices configured to operate as an optical amplifier and a photodetector, respectively.

27 Claims, 5 Drawing Sheets

(51) Int. Cl.

| | | |
|---|---|---|
| *H04B 10/40* | (2013.01) | |
| *H04B 10/50* | (2013.01) | |
| *H04B 10/60* | (2013.01) | |
| *H04B 10/70* | (2013.01) | |
| *H01S 5/183* | (2006.01) | |
| *H04B 10/291* | (2013.01) | |
| *H04B 10/516* | (2013.01) | |
| *H01S 5/022* | (2006.01) | |
| *H01S 5/20* | (2006.01) | |
| *H01S 5/50* | (2006.01) | |
| *H01S 5/00* | (2006.01) | |
| *H01S 5/042* | (2006.01) | |
| *H01S 5/02* | (2006.01) | |

(52) U.S. Cl.
CPC ..... *H01S 5/18341* (2013.01); *H04B 10/2914* (2013.01); *H04B 10/40* (2013.01); *H04B 10/50* (2013.01); *H04B 10/516* (2013.01); *H04B 10/60* (2013.01); *H04B 10/70* (2013.01); *H01S 5/005* (2013.01); *H01S 5/0085* (2013.01); *H01S 5/0217* (2013.01); *H01S 5/02272* (2013.01); *H01S 5/04257* (2019.08); *H01S 5/18308* (2013.01); *H01S 5/2063* (2013.01); *H01S 5/50* (2013.01)

(58) Field of Classification Search
CPC ...... H04B 10/50; H04B 10/27; H04B 10/516; H04B 10/532; H04J 14/02
USPC ....... 398/135, 136, 137, 138, 139, 140, 158, 398/159, 79, 164, 192, 193, 194, 200, 398/201, 183; 372/32, 34, 36, 38.02; 385/88, 89, 90, 92, 93
See application file for complete search history.

(56) References Cited

U.S. PATENT DOCUMENTS

| | | | |
|---|---|---|---|
| 5,966,234 | A | 10/1999 | Ford et al. |
| 6,330,089 | B1 | 12/2001 | Yamada |
| 6,466,349 | B1 | 10/2002 | Valley et al. |
| 6,690,894 | B2 | 2/2004 | Ho et al. |
| 6,785,447 | B2 | 8/2004 | Yoshimura et al. |
| 6,853,479 | B1 | 2/2005 | Ilchenko et al. |
| 7,065,300 | B1* | 6/2006 | Walker .................. H01S 5/0265 359/263 |
| 7,223,993 | B2 | 5/2007 | Nakahara et al. |
| 7,443,561 | B2 | 10/2008 | Bour et al. |
| 7,512,295 | B2 | 3/2009 | Welch et al. |
| 7,583,894 | B2 | 9/2009 | Kang |
| 7,636,501 | B2 | 12/2009 | Doerr et al. |
| 7,929,813 | B2 | 4/2011 | Doerr et al. |
| 7,983,562 | B1 | 7/2011 | Yap et al. |
| 7,983,572 | B2* | 7/2011 | Deng .................. H01S 5/18302 398/182 |
| 8,754,445 | B2 | 6/2014 | Ishibashi et al. |
| 9,411,177 | B2 | 8/2016 | Cunningham et al. |
| 9,413,465 | B2 | 8/2016 | Tanaka |
| 9,599,781 | B1 | 3/2017 | Skogen et al. |
| 9,823,497 | B1 | 11/2017 | Skogen |
| 9,838,135 | B1 | 12/2017 | Xu et al. |
| 9,853,416 | B2 | 12/2017 | Chen et al. |
| 2002/0179929 | A1 | 12/2002 | Takahashi et al. |
| 2003/0010905 | A1 | 1/2003 | Luo |
| 2003/0147127 | A1 | 8/2003 | Duling et al. |
| 2003/0201462 | A1 | 10/2003 | Pommer et al. |
| 2004/0109217 | A1 | 6/2004 | Maleki et al. |
| 2004/0136662 | A1 | 7/2004 | Takagi et al. |
| 2005/0141801 | A1 | 6/2005 | Gardner |
| 2006/0029111 | A1 | 2/2006 | Liu |
| 2007/0269170 | A1 | 11/2007 | Easton et al. |
| 2008/0001062 | A1 | 1/2008 | Gunn et al. |
| 2008/0138088 | A1* | 6/2008 | Welch .................. H01S 5/026 398/183 |
| 2009/0116025 | A1 | 5/2009 | Maryfield et al. |
| 2010/0008671 | A1 | 1/2010 | Pratt |
| 2010/0111466 | A1 | 5/2010 | Doerr et al. |
| 2010/0246614 | A1 | 9/2010 | Koshi et al. |
| 2011/0020010 | A1 | 1/2011 | Bruno et al. |
| 2011/0044369 | A1* | 2/2011 | Andry .................. G02B 6/4204 372/50.124 |
| 2012/0002978 | A1 | 1/2012 | Healey et al. |
| 2012/0263416 | A1* | 10/2012 | Morioka .............. G02B 6/4214 385/33 |
| 2012/0269514 | A1 | 10/2012 | Nedovic |
| 2012/0321316 | A1 | 12/2012 | Presi et al. |
| 2012/0328235 | A1 | 12/2012 | Christensen et al. |
| 2013/0256514 | A1 | 10/2013 | Devgan et al. |
| 2015/0125159 | A1* | 5/2015 | Kim .................... H04B 10/501 398/183 |
| 2016/0004021 | A1 | 1/2016 | Pelletier et al. |
| 2017/0184450 | A1 | 6/2017 | Doylend et al. |
| 2017/0207600 | A1 | 7/2017 | Klamkin et al. |
| 2018/0296067 | A1 | 10/2018 | Amling et al. |
| 2019/0312642 | A1 | 10/2019 | Neilson et al. |
| 2019/0312646 | A1 | 10/2019 | Earnshaw |
| 2019/0312653 | A1 | 10/2019 | Low et al. |

OTHER PUBLICATIONS

Raring, James W., and Larry A. Coldren. "40-Gb/s widely tunable transceivers." IEEE Journal of Selected Topics in Quantum Electronics 13.1 (2007): 3-14.

Urino, Y., et al., "High density optical interconnects integrated with lasers, optical modulators and photodetectors on a single silicon chip." In Optical Fiber Communication Conference and Exposition and the National Fiber Optic Engineers Conference (OFC/NFOEC), 2013, pp. 1-3.

Kang, I., "Phase-shift-keying and on-off-keying with improved performances using electroabsorption modulators with interferometric effects." Optics express 15.4 (2007): 1467-1473.

Noharet, B., et al. "Arrays of surface-normal electroabsorption modulators for the generation and signal processing of microwave photonics signals." Microwave Photonics, 2011 International Topical Meeting on & Microwave Photonics Conference, 2011 Asia-Pacific, MWP/APMP. IEEE, 2011, pp. 282-283.

Quintana, C., et al. "High Speed Electro-absorption Modulator for Long Range Retroreflective Free Space Optics." IEEE Photonics Technology Letters 29.9 (2016): 707-710.

Schrenk, B., et al. "Flexible optical QAM generation with a low-complexity amplified InP SOA/EAM-based modulator." In Optical Communications (ECOC), IEEE, 2012 38th European Conference and Exhibition. pp. 1-3.

Wang, Qin, et al. "1550 nm transmissive/reflective surface-normal electroabsorption modulator arrays" Electronics Letters 42.1 (2006): 47-49.

Earnshaw, Mark P., et al. "Optical Transmitter Having an Array of Surface-Coupled Electro-Absorption Modulators", U.S. Appl. No. 15/946,061, 2018.

Low, Y. et al. "Chip-In-Connector Photonic Apparatus", U.S. Appl. No. 15/946,353, 29 pages, 2018.

Neilson, D., "Reflective Optical Data Modulator", U.S. Appl. No. 62/653,152, 26 pages, 2018.

Earnshaw, M., "Optical Communication With Wavelength-Dependent Amplitude Pre-Compensation", U.S. Appl. No. 62/653,551, 18 pages, 2018.

"6015-3-APC—Fiber Optic Circulator, 1525-1610 nm, SMF, FC/APC", www.thorlabs.com, 2018 [retrieved on Mar. 30, 2018] Retrieved from the Internet: <URL: https://www.thorlabs.com/thorproduct.cfm?partnumber=6015-3-APC> (1 pages).

Kagawa, Toshiaki et al., "A Surface-Normal Reflective Optical Modulator at a Wavelength of 1.3µm Using the Wannier-Stark Effect of the InP/InGaAsP Superlattice." Conference Proceedings. 1997 International Conference on Indium Phosphide and Related Materials. IEEE, 1997. pp. 103-106.

(56) References Cited

OTHER PUBLICATIONS

Extended European Search Report for corresponding European application No. 19166045.5; dated Sep. 23, 2019 (12 pages).

* cited by examiner

201

203

200

COMMUNICATION SYSTEM EMPLOYING SURFACE-COUPLED OPTICAL DEVICES

BACKGROUND

Field

Various example embodiments relate to optical communication equipment and, more specifically but not exclusively, to optical transmitters and receivers.

Description of the Related Art

This section introduces aspects that may help facilitate a better understanding of the disclosure. Accordingly, the statements of this section are to be read in this light and are not to be understood as admissions about what is in the prior art or what is not in the prior art.

An optical transceiver may include one or more of the following optical devices: (i) an electrically driven light source, such as a laser diode; (ii) an optical amplifier; (iii) an optical-to-electrical converter, such as a photodiode; and (iv) an optoelectronic component that can control propagation and/or certain properties of light, such as an optical modulator or an optical switch. The optical transceiver may additionally include one or more electronic components that enable the use of these and possibly other optical devices in a manner consistent with the intended function or application. Different integration and packaging technologies may be used to combine various optical devices and the corresponding electronic components into a functional, practically useful integrated circuit, package, card, and/or assembly. Such technologies continue to expand and evolve, e.g., through the development of new solutions for the emerging products and applications.

SUMMARY OF SOME SPECIFIC EMBODIMENTS

Disclosed herein are various embodiments of optical transmitters, receivers, and transceivers implemented using a plurality of surface-coupled optical devices that can be manufactured on the same planar substrate and then post-processed to provide some of the devices with different respective partially transparent front mirrors compatible with and/or customized for different respective optical functions. When appropriately electrically biased and driven, different subsets of such devices can operate as lasers, optical modulators, optical amplifiers, and photodetectors, respectively. In this manner, an integrated array of such devices can be customized to provide the optical functions needed for the intended end product. For example, an optical transmitter can be constructed using an integrated array that comprises three surface-coupled optical devices configured to operate as a laser, an optical modulator, and an optical amplifier, respectively. An optical receiver can be constructed using an integrated array that comprises two surface-coupled optical devices configured to operate as an optical amplifier and a photodetector, respectively.

Advantageously, the use of integrated arrays of such surface-coupled optical devices can help to streamline the system design, simplify the system integration/packaging, and/or reduce the system development and production costs.

According to an example embodiment, provided is an apparatus comprising a plurality of optical devices supported on a planar surface, each of the optical devices being configured to receive light, emit light, or receive and emit light substantially orthogonally to the planar surface; wherein the plurality of optical devices includes a first optical device and a second optical device; wherein the first optical device is configured to operate as an optical device of a first type; wherein the second optical device is configured to operate as an optical device of a second type different from the first type; and wherein the first type and the second type are selected from a device-type set consisting of a vertical-cavity surface-emitting laser, a semiconductor optical amplifier, a reflective optical modulator, and a photodetector.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Some embodiments of the present application may be able to use some features, apparatus, and/or methods disclosed in one or more of the below-listed and concurrently filed, U.S. applications:

U.S. patent application Ser. No. 15/946,061, titled "OPTICAL TRANSMITTER HAVING AN ARRAY OF SURFACE-COUPLED ELECTRO-ABSORPTION MODULATORS", by Mark Earnshaw and Stefano Grillanda;

U.S. patent application Ser. No. 15/946,353, titled "CHIP-IN-CONNECTOR PHOTONIC APPARATUS", by Yee Low and Nagesh Basavanhally;

U.S. Provisional patent application No. 62/653,152, titled "REFLECTIVE OPTICAL DATA MODULATOR", by David Neilson; and U.S. Provisional patent application No. 62/653,551, titled "OPTICAL COMMUNICATION WITH WAVELENGTH-DEPENDENT AMPLITUDE PRE-COMPENSATION", by Mark Earnshaw.

Each of the four above-listed U.S. applications is incorporated herein, by reference, in its entirety.

Figure 1:
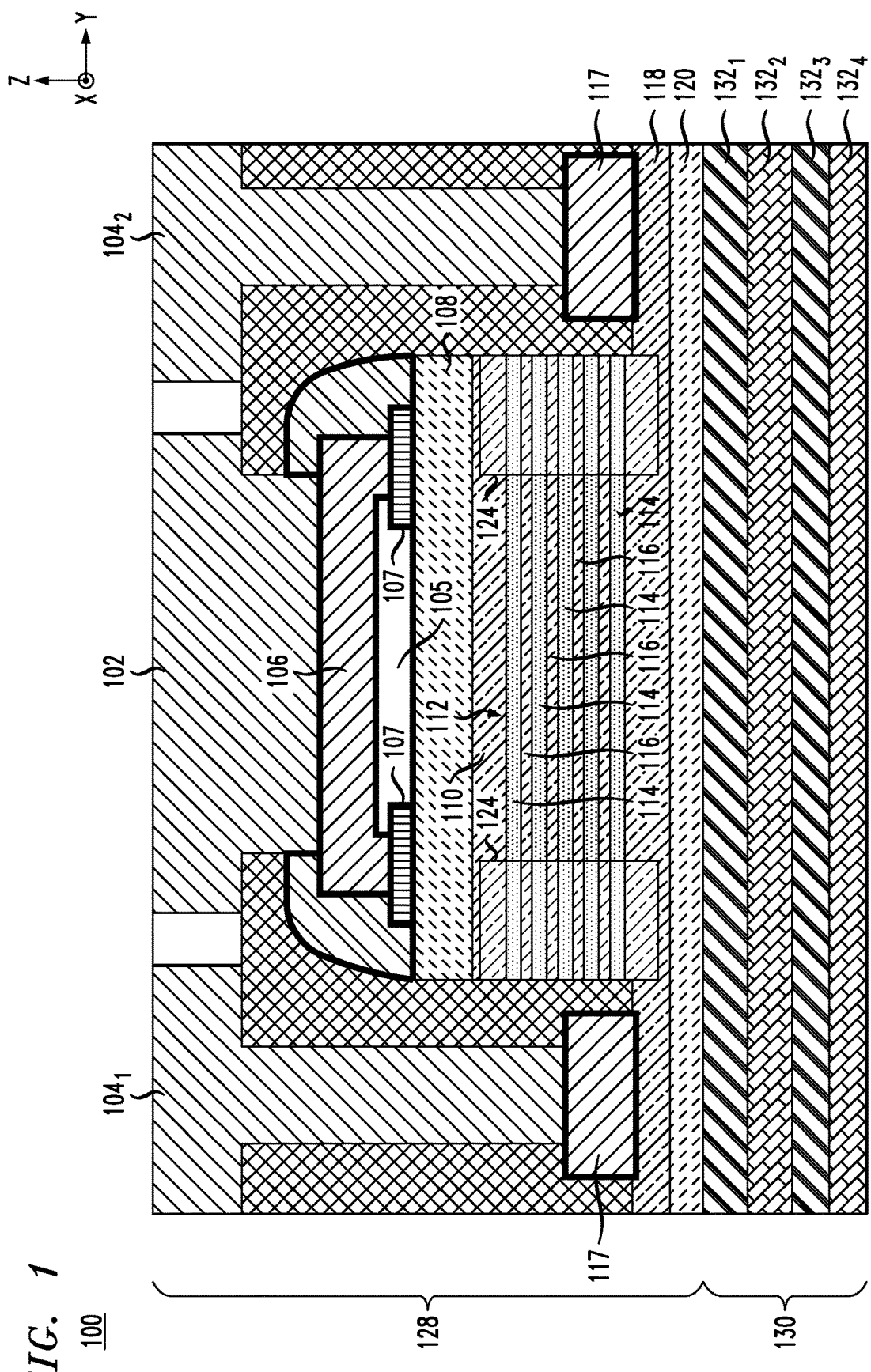
FIG. 1 shows a schematic cross-sectional side view of a surface-coupled optical device (SCOD) according to an embodiment.

FIG. 1 shows a schematic cross-sectional side view of a surface-coupled optical device (SCOD) 100 according to an embodiment. Depending on the electrical configuration, SCOD 100 can be operated as a vertical-cavity surface-emitting laser (VCSEL), a semiconductor optical amplifier (SOA), an electro-absorption modulator (EAM), or a photodetector (PD). The different electrical configurations corresponding to these four different optical functions of SCOD 100 are described in more detail below.

In some embodiments, the same physical instance of SCOD 100 can be reconfigurable, e.g., by changing the electrical configuration thereof, to provide any selected one of the four above-mentioned optical functions or any selected one of a subset of the four optical functions. In such embodiments, the optical function of that particular SCOD 100 can be changed, e.g., by changing the electrical configuration thereof, such as the bias voltage and/or the bias-voltage polarity applied thereto.

In some other embodiments, SCOD 100 can be designed to perform a selected one of the four optical functions, e.g., by having certain physical characteristics that are beneficial for and/or geared towards that particular optical function. In some of such embodiments, that particular SCOD 100 may not be able to perform at least some of the other three optical functions even if placed into a corresponding electrical configuration.

SCOD 100 is "surface-coupled" in the sense that, in operation, this device receives and/or emits a light beam in a direction that is substantially orthogonal to the main plane of the device, which is parallel to the XY-coordinate plane of the XYZ triad shown in FIG. 1. The XY-coordinate plane typically corresponds to the main plane of the planar substrate on which the layered structure of SCOD 100 has been formed during fabrication (see, e.g., FIGS. 2A-2C). Due to this geometry, a large number of SCODs 100 can be manufactured on a single substrate (e.g., a semiconductor wafer).

SCOD 100 includes a plurality of layers that are substantially parallel to the XY-coordinate plane. The direction orthogonal to those layers (i.e., parallel to the Z-coordinate axis) may hereafter be referred to as the vertical or surface-normal direction. The directions parallel to those layers may hereafter be referred to as the horizontal or lateral directions. Some of the layers may include two or more sub-layers (not explicitly shown in FIG. 1) that differ from each other in chemical composition and/or the concentration and type of the introduced dopant(s). SCOD 100 also includes metal electrodes 102 and $104_1$-$104_2$ electrically connected to some of the layers as described in more detail below. In an example embodiment, the vertical size (or thickness) of SCOD 100 is significantly smaller than its lateral size (e.g., depth and/or width).

In some embodiments, metal electrodes $104_1$-$104_2$ can be electrically connected to one another by being parts of the same electrode having, e.g., an O-shape in the top view thereof (e.g., if viewed along the Z-coordinate axis).

SCOD 100 comprises an optical resonator defined by mirrors 106 and 130.

In an example embodiment, mirror 106 is a metal (e.g., gold or gold-plated) mirror having relatively high (e.g., >99%) reflectivity at the nominal operating wavelength at the side of the mirror facing down (in the projection shown in FIG. 1). Mirror 106 is typically such that it does not allow any light to pass therethrough. As a result, the shown embodiment of SCOD 100 can typically be used only in an optical configuration that does not require light to be transmitted through the SCOD, e.g., in reflection.

In some alternative embodiments, mirror 106 can be replaced by a suitable distributed Bragg reflector (DBR) mirror. As known in the pertinent art, a DBR mirror can be formed, e.g., using a stack of semiconductor or dielectric layers, each having a quarter-wavelength thickness, with adjacent layers of the stack having alternating refractive indices. In such embodiments, SCOD 100 may be used in transmission.

In an example embodiment, mirror 130 is a partially transparent dielectric mirror that enables light of the nominal operating wavelength to be properly coupled into and/or out of the optical resonator. For illustration purposes and without any implied limitations, FIG. 1 shows an embodiment in which mirror 130 comprises four dielectric layers $132_1$-$132_4$. In an alternative embodiment, mirror 130 can be implemented using a different (from four) number of constituent dielectric layers.

In some embodiments, layers $132_1$ and $132_3$ comprise silicon dioxide, and layers $132_3$ and $132_4$ comprise silicon nitride. In an alternative embodiment, mirror 130 can be implemented using dielectric layers of other suitable chemical composition.

In some embodiments, mirror 130 can be replaced by a suitable DBR mirror made of semiconductor materials.

The optical resonator defined by mirrors 106 and 130 includes p-type semiconductor layers 108 and 110, n-type semiconductor layers 118 and 120, and a multiple-quantum-well (MQW) structure 112 sandwiched therebetween. MQW structure 112 comprises a stack of alternating relatively thin layers 114 and 116 made of different respective semiconductor materials. In an example embodiment, the semiconductor materials of layers 114 and 116 are intrinsic semiconductors. Layer 108 may have a higher dopant concentration than layer 110, such that layers 108 and 110 can be referred to as p+ and p layers, respectively. Layer 120 may similarly have a higher dopant concentration than layer 118, such that layers 120 and 118 can be referred to as n+ and n layers, respectively.

In some embodiments, MQW structure 112 may comprise quantum dots (not explicitly shown in FIG. 1), each quantum dot being respective quantum well. In some embodiments, quantum dots may be used in addition to or instead of the layer-type quantum wells shown in FIG. 1.

In the embodiment shown in FIG. 1, the optical resonator defined by mirrors 106 and 130 also includes an optional dielectric layer 105 located between mirror 106 and semiconductor layer 108. In an example embodiment, this layer comprises $SiO_2$ or $Si_3N_4$. In an alternative embodiment, layer 105 can be absent.

A person of ordinary skill in the art will understand that the choices of (i) the semiconductor materials for layers 108, 110, 114, 116, 118, and 120 and (ii) the vertical distance between mirrors 106 and 130 may depend on the intended operating wavelength of SCOD 100. For example, different telecommunications applications may use different embodiments of SCOD 100 designed for the spectral bands located near 850 nm, 1300 nm, and 1550 nm, respectively.

In some embodiments, SCOD 100 may include additional layers (not explicitly shown in FIG. 1) located between layers 120 and $132_1$. An example of such layers can be one or more etch-stop layers and one or more buffer layers used in the manufacturing process, e.g., as explained below in reference to FIGS. 2A-2C.

In an example embodiment, the following semiconductor materials can be used to implement SCOD 100: (i) Zn-doped In(x)Ga(1−x−y)Al(y)As for layer 108; (ii) Zn-doped In(x)Al(1−x)As for layer 110; (iii) In(x)Ga(1−x)As for layers 114; (iv) In(x)Al(1−x)As for layers 116; (v) Si-doped In(x)Al(1−x)As for layer 118; and (vi) Si-doped In(x)Ga(1−x−y)Al(y)As for layer 120. In alternative embodiments, other semiconductor materials and dopants can also be used.

In an example embodiment, layers 110 and 118 and MQW structure 112 form a p-i-n diode (also sometimes referred to as a "PIN diode") that can be electrically biased using electrodes 102 and 104. Ohmic contact between electrode 102 and layer 110 can be created using metal contact pads 107 and layer 108 as known in the art. Ohmic contact between electrode(s) 104 and layer 118 can be created using metal contact pads 117 and an additional thin n+ or n++ semiconductor layer (not explicitly shown in FIG. 1) located between contact pads 117 and layer 118.

To operate SCOD 100 as a VCSEL, electrodes 102 and 104 can be electrically connected to apply an appropriate forward bias to PIN diode 110/112/118.

As used herein, the term "forward bias" refers to an electrical configuration of a semiconductor-junction diode in which the n-type material is at a low potential, and the p-type material is at a high potential. If the forward bias is greater than the intrinsic voltage drop $V_{pn}$ across the corresponding p-i-n junction, then the corresponding potential barrier can be overcome by the electrical carriers, and a relatively large forward current can flow through the junction. For example, for silicon-based diodes the value of $V_{pn}$ is approximately 0.7 V. For germanium-based diodes, the value of $V_{pn}$ is approximately 0.3 V, etc.

When PIN diode 110/112/118 is appropriately forward-biased, a relatively large injection current flows through MQW structure 112, thereby causing the MQW structure to generate light that is then amplified due to the multiple passes therethrough caused by light oscillation in the optical resonator between mirrors 106 and 130. The light generated in this manner can escape from the optical resonator of SCOD 100 through mirror 130, thereby generating an output light beam. A person of ordinary skill in the art will understand that to enable the VCSEL function, SCOD 100 needs to be capable of a relatively high optical gain, which can be achieved, in part, by properly selecting the materials and structure of mirror 130.

To operate SCOD 100 as an SOA, electrodes 102 and 104 can be electrically connected to apply an appropriate forward bias to PIN diode 110/112/118, which forward bias may be different from that used in the above-described VCSEL configuration. More specifically, in the SOA configuration, the gain provided by the optical resonator of SCOD 100 is typically below the lasing threshold, but is nevertheless sufficient for generating new light, through stimulated emission, in response to an external light beam coupled into the optical resonator through mirror 130. The corresponding value of the optical gain can be achieved, in part, by properly selecting the materials and structure of mirror 130. In some embodiments, the materials and structure of mirror 130 selected to provide a desired SOA function of SCOD 100 may be different from those used to provide the above-described VCSEL function.

To operate SCOD 100 as an EAM, electrodes 102 and 104 can be electrically connected to apply to PIN diode 110/112/118 a combination of an appropriate reverse bias and a driving radio-frequency (RF) signal.

As used herein, the term "reverse bias" refers to an electrical configuration of a semiconductor-junction diode in which the n-type material is at a high electrical potential, and the p-type material is at a low electrical potential. The reverse bias typically causes the depletion layer to grow wider due to a lack of electrons and/or holes, which presents a high impedance path across the junction and substantially prevents a current flow therethrough. However, a very small reverse leakage current can still flow through the junction in the reverse-bias configuration.

The principle of operation of SCOD 100 in the EAM configuration is based on the so-called quantum-confined Stark effect (QCSE) due to which the optical absorption near the effective band edge of MQW structure 112 depends on the applied electric field. More specifically, the reverse bias applied to the PIN diode 110/112/118 causes MQW structure 112 to be subjected to an electric field of certain strength. During the positive swing of the driving RF signal, the electric-field strength increases, thereby red-shifting the band edge. During the negative swing of the driving RF signal, the electric-field strength decreases, thereby blue-shifting the band edge. These band-edge shifts change the light transmittance of MQW structure 112 at the carrier wavelength, thereby modulating the intensity of light that oscillates in the optical resonator between mirrors 106 and 130 and escapes from the optical resonator through mirror 130.

A person of ordinary skill in the art will understand that an optimized EAM function of SCOD 100 may be facilitated, at least in part, by a corresponding (e.g., different from any of the above-described) selection of the materials and structure of mirror 130.

To operate SCOD 100 as a PD, electrodes 102 and 104 can be electrically connected to apply to PIN diode 110/112/118 an appropriate dc reverse bias, which may be different from (e.g., larger than) that used in the above-described EAM configuration. The reverse bias creates a relatively large electric field across the p-i-n junction that can separate the electrical carriers (e.g., holes and electrons) generated therein by the absorbed light coupled into the optical resonator of SCOD 100 through mirror 130. The separated electrical carriers generate a photocurrent that can be collected and measured as known in the art to determine the light intensity.

A person of ordinary skill in the art will understand that an optimized PD function of SCOD 100 may be facilitated, at least in part, by a corresponding (e.g., different from any of the above-described) selection of the materials and structure of mirror 130.

The lateral dimensions of the optical resonator in SCOD 100 can be defined using an external aperture (not explicitly shown in FIG. 1) and/or ion-implanted regions 124. Ion-implanted regions 124 can be formed by implanting suitable ions (e.g., the hydrogen ions, $H^+$) into MQW structure 112 around its periphery, e.g., as indicated in FIG. 1. The ion-implantation process disrupts, perturbs, and/or destroys the semiconductor lattice in regions 124, thereby inhibiting the flow of electrical current(s) therethrough and/or hindering the physical processes therein that are pertinent to the above-described optical functions of SCOD 100. In an example embodiment, the middle portion of MQW structure 112 laterally bounded by regions 124 may have an approximately circular cross-sectional shape in a plane parallel to the XY-coordinate plane. In alternative embodiments, other cross-sectional geometric shapes are also possible.

Encapsulating and/or filler materials can be used as known in the pertinent art to cover and/or fill the gaps (if any) between the various layers, structures, and electrodes of SCOD 100, thereby providing a substantially monolithic and mechanically robust overall device structure.

One beneficial optical characteristic of SCOD 100 is that its operation, in various above-described configurations, can be substantially polarization-independent due to the surface-coupled nature of the device. For comparison, waveguide-based semiconductor optical devices (e.g., lasers, amplifiers, modulators, and photodetectors) can typically be polarization-dependent, e.g., due to a relatively large difference in the group indices (i.e., effective refractive indices) of the transverse electric (TE) and transverse magnetic (TM) polarizations in the corresponding optical waveguides. This particular characteristic can make it relatively difficult to construct a polarization-diverse waveguide-based semiconductor optical device having a substantially polarization-independent response and/or capable of appropriately handling polarization-division-multiplexed (PDM)

signals. Advantageously, the latter problem can be significantly alleviated or avoided altogether with the use of various embodiments of SCOD 100.

Figure 2A:
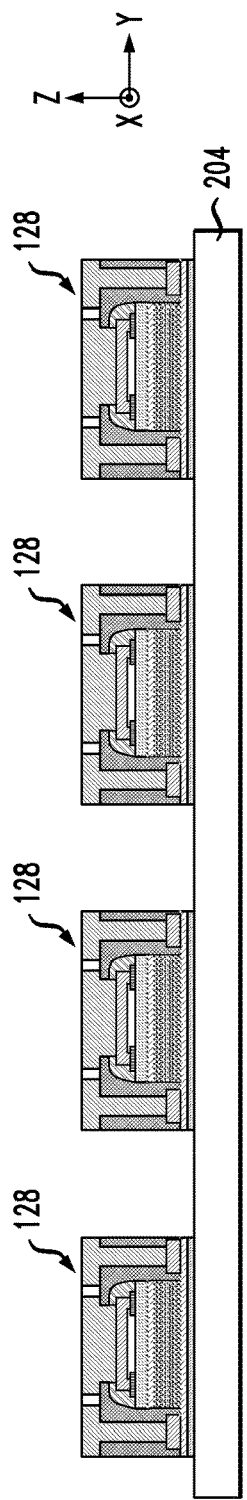
FIGS. 2A-2C pictorially illustrate a manufacturing method that can be used to make an array of SCODs of FIG. 1 according to an embodiment.
Figure 2B:
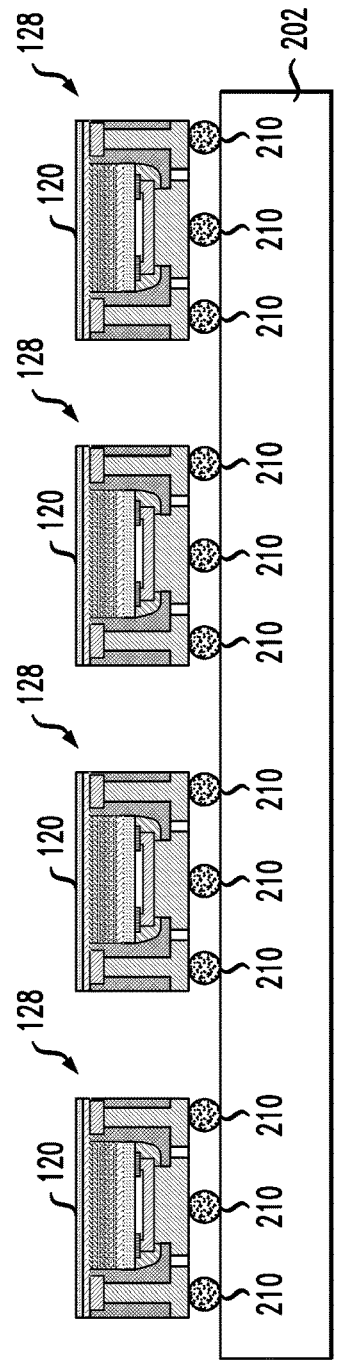
Figure 2C:
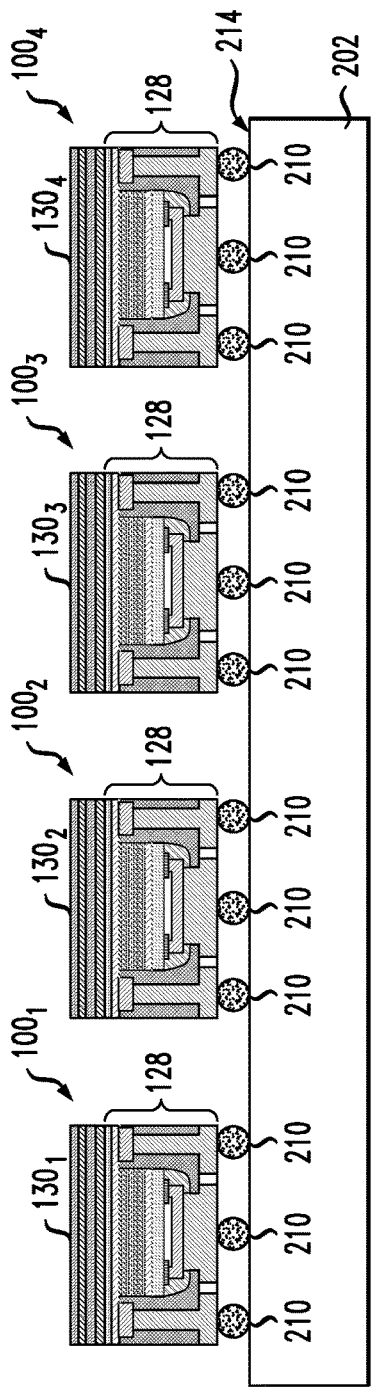

FIGS. 2A-2C pictorially illustrate a manufacturing method that can be used to make an array 200 of SCODs 100 according to an embodiment.

FIG. 2C shows a schematic cross-sectional side view of array 200. For illustration purposes and without any implied limitations, FIG. 2C shows an embodiment in which array 200 comprises four SCODs 100, which are labeled $100_1$-$100_4$. In an alternative embodiment, array 200 may have a different (from four) number of SCODs 100.

SCODs $100_1$-$100_4$ are supported on and electrically and mechanically connected to a device carrier 202 using solder bumps 210 attached to electrodes 102, 104 (also see FIG. 1). The orientation of SCODs $100_1$-$100_4$ is such that mirrors 130 are facing away from a surface 214 of device carrier 202, on which the SCODs are mounted. Electrical connections between each of SCODs $100_1$-$100_4$ and the corresponding external electrical circuit(s) (such as, circuit 510, FIG. 5) can be provided by patterned conducting (such as metal) layers located within the body and/or on surface 214 of device carrier 202. In various embodiments, device carrier 202 can be implemented using any one or any suitable combination of the following: one or more substrates, one or more redistribution layers (RDLs), one or more interposers, one or more laminate plates, and one or more circuit sub-mounts, etc.

In some embodiments, SCODs $100_1$-$100_4$ can be nominally identical.

In some other embodiments, SCODs $100_1$-$100_4$ may have nominally identical portions 128 (also see FIG. 1), but different respective mirrors $130_1$-$130_4$. In such embodiments, some of mirrors $130_1$-$130_4$ may differ from some of the other mirrors, e.g., in reflectivity/transmissivity, thickness, the number of constituent layers 132 (see FIG. 1), and/or the chemical composition of at least some of those constituent layers.

In some embodiments, different subsets of SCODs $100_1$-$100_4$ may be specifically designed and configured to perform different respective optical functions selected from the above-described VCSEL, SOA, EAM, and PD functions. In different ones of such embodiments, the number of such subsets can be two, three, or four.

Array 200 of FIG. 2C can be fabricated by first forming a corresponding array 201 of portions 128 on a suitable substrate 204 as illustrated in FIG. 2A. In an example embodiment, substrate 204 can be an InP substrate. Portions 128 can be formed on substrate 204 in a conventional manner, e.g., using a multistep fabrication process comprising at least some of the following: photolithography, ion implantation, dry and/or wet etching, thermal treatments and anneals, oxidation, chemical and physical vapor deposition, epitaxial growth, electrochemical deposition, and chemical-mechanical planarization.

In the next fabrication step, array 201 is flip-chip bonded to device carrier 202 using solder bumps 210. After the flip-chip bonding, substrate 204 is removed, e.g., by reactive etching, thereby exposing layers 120 of portions 128 (e.g., as indicated in FIG. 2B) or the corresponding etch-stop layers (not explicitly shown in FIG. 2). Mirrors $130_1$-$130_4$ are then formed on the exposed top surfaces of the resulting circuit 203 (FIG. 2B), thereby converting the latter into array 200 (FIG. 2C).

Figure 3:
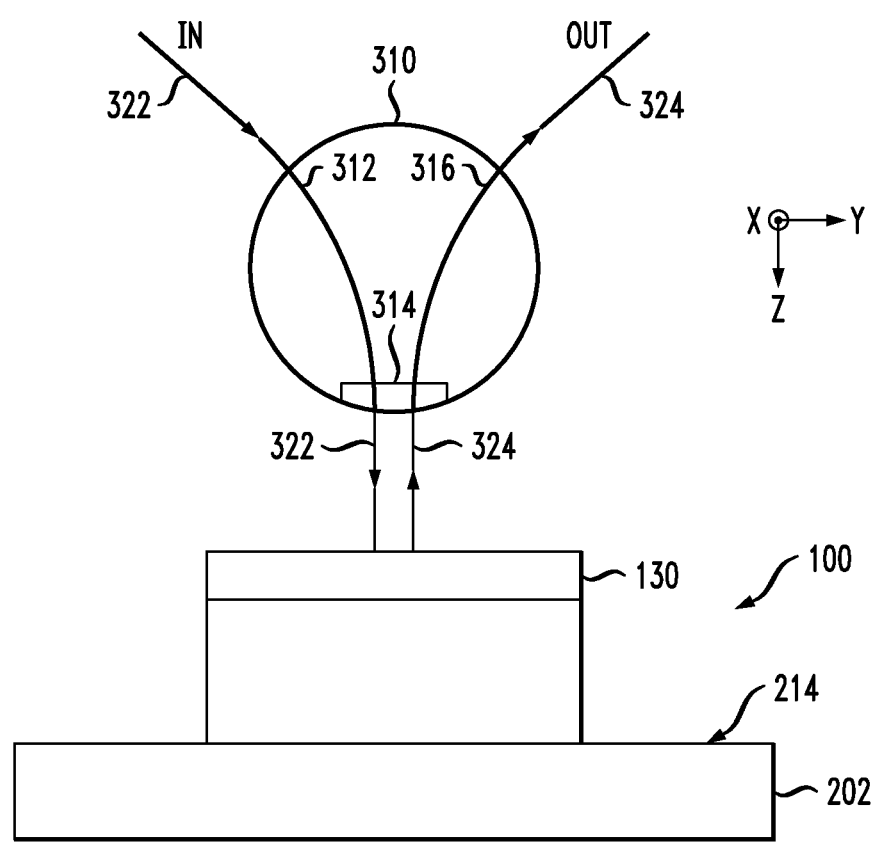
FIG. 3 shows a block diagram of an optical assembly that includes a SCOD of FIG. 1 according to an embodiment.

FIG. 3 shows a block diagram of an optical assembly 300 according to an embodiment. Optical assembly 300 comprises a SCOD 100 mounted on device carrier 202, e.g., as described above in reference to FIGS. 2A-2C. Optical assembly 300 further comprises an optical circulator 310 configured to couple light in and/or out of SCOD 100.

Optical circulator 310 has three optical ports, which are labeled in FIG. 3 using reference numerals 312, 314, and 316, respectively. Port 312 is configured to direct an optical input beam 322 received from an external light source to port 314. Port 314 is configured to direct light of beam 322 toward mirror 130 of SCOD 100. Port 314 is further configured to receive an optical output beam 324 emitted by SCOD 100 through mirror 130 and direct it to port 316. Port 316 is configured to direct light of optical beam 324 to external circuits.

In some embodiments, a lens (not explicitly shown in FIG. 3) may be placed between port 314 of optical circulator 310 and mirror 130 of SCOD 100 to improve the optical coupling efficiency and/or reduce optical losses.

In some embodiments, port 314 may comprise a collimator configured to collimate the light thereat.

In some embodiments, optical circulator 310 can be implemented using the fiber-optic circulator Model 6015-3-APC commercially available from Thorlabs, Inc.

In some embodiments, an array of optical circulators 310 may be used to couple light in and out of array 200 (FIG. 2C). In such an array, not all of the ports of optical circulators 310 may be used. For example, an optical circulator 310 optically coupled to a SCOD 100 configured to operate as a VCSEL may use only ports 314 and 316 to couple the light of output optical beam 324 out of the that SCOD. As another example, an optical circulator 310 optically coupled to a SCOD 100 configured to operate as a PD may use only ports 312 and 314 to couple the light of input optical beam 322 into that SCOD.

Figure 4:
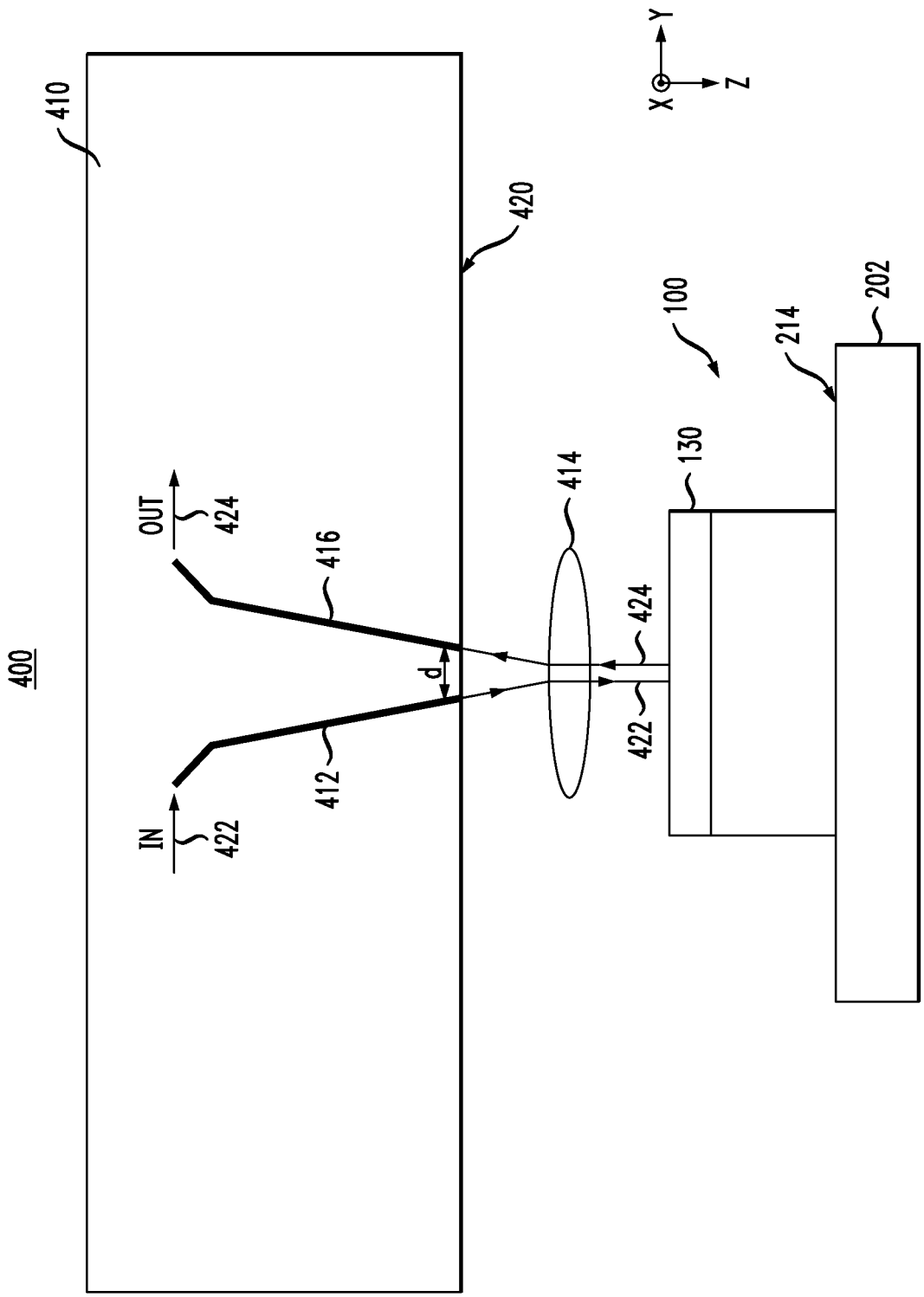
FIG. 4 shows a block diagram of an optical assembly that includes a SCOD of FIG. 1 according to another embodiment.

FIG. 4 shows a block diagram of an optical assembly 400 according to another embodiment. Optical assembly 400 comprises a SCOD 100 mounted on device carrier 202, e.g., as described above in reference to FIGS. 2A-2C. Optical assembly 400 further comprises a planar lightwave circuit (PLC) 410 configured to couple light in and/or out of SCOD 100. The main plane of planar lightwave circuit 410 is parallel to the YZ-coordinate plane.

Circuit 410 comprises optical waveguides 412 and 416 connected to an edge 420 of that circuit as indicated in FIG. 4. More specifically, the end portions of waveguides 412 and 416 are oriented with respect to edge 420 at an angle that is slightly (e.g., within ±10 degrees) different from 90 degrees. The ends of waveguides 412 and 416 are separated from one another by a relatively small distance d selected such that both ends are in the field of view of a coupling lens 414 located between edge 420 of circuit 410 and mirror 130 of SCOD 100.

In some alternative embodiments, lens 414 can be replaced by a suitable set of two or more different lenses configured for optimal light-coupling efficiency for the intended application of circuit 400.

In some other alternative embodiments, lens 414 can be removed, and edge 420 can be positioned to be in very close proximity to (e.g., in direct contact with) mirror 130.

In the shown embodiment, waveguide 412 is configured to direct, through lens 414, an optical input beam 422 received from an external light source toward mirror 130. Waveguide 416 is configured to receive, through lens 414, an optical output beam 424 emitted by SCOD 100 through mirror 130 and direct it to external circuits. Lens 414 is configured to appropriately shape and redirect optical beams 422 and 424 to provide a relatively high optical-coupling efficiency between circuit 410 and SCOD 100.

In some embodiments, circuit 410 may be used to couple light in and out of array 200 (FIG. 2C). In such embodiments, circuit 410 may have multiple pairs of optical waveguides 412 and 416 (not explicitly shown in FIG. 4; see FIG. 5) connected to edge 420. Some of such pairs may be configured to use only one of the two respective waveguides. For example, optical waveguides 412 and 416 optically coupled to a SCOD 100 configured to operate as a VCSEL may use only waveguide 416 to couple the light of output optical beam 424 out of the that SCOD. As another example, optical waveguides 412 and 416 optically coupled to a SCOD 100 configured to operate as a PD may use only waveguide 412 to couple the light of input optical beam 422 into that SCOD.

Additional embodiments of circuit 410 may be constructed and operated using waveguide circuits and optical arrangements disclosed, e.g., in U.S. patent application Ser. No. 15/445,099, which is incorporated herein by reference in its entirety.

Figure 5:
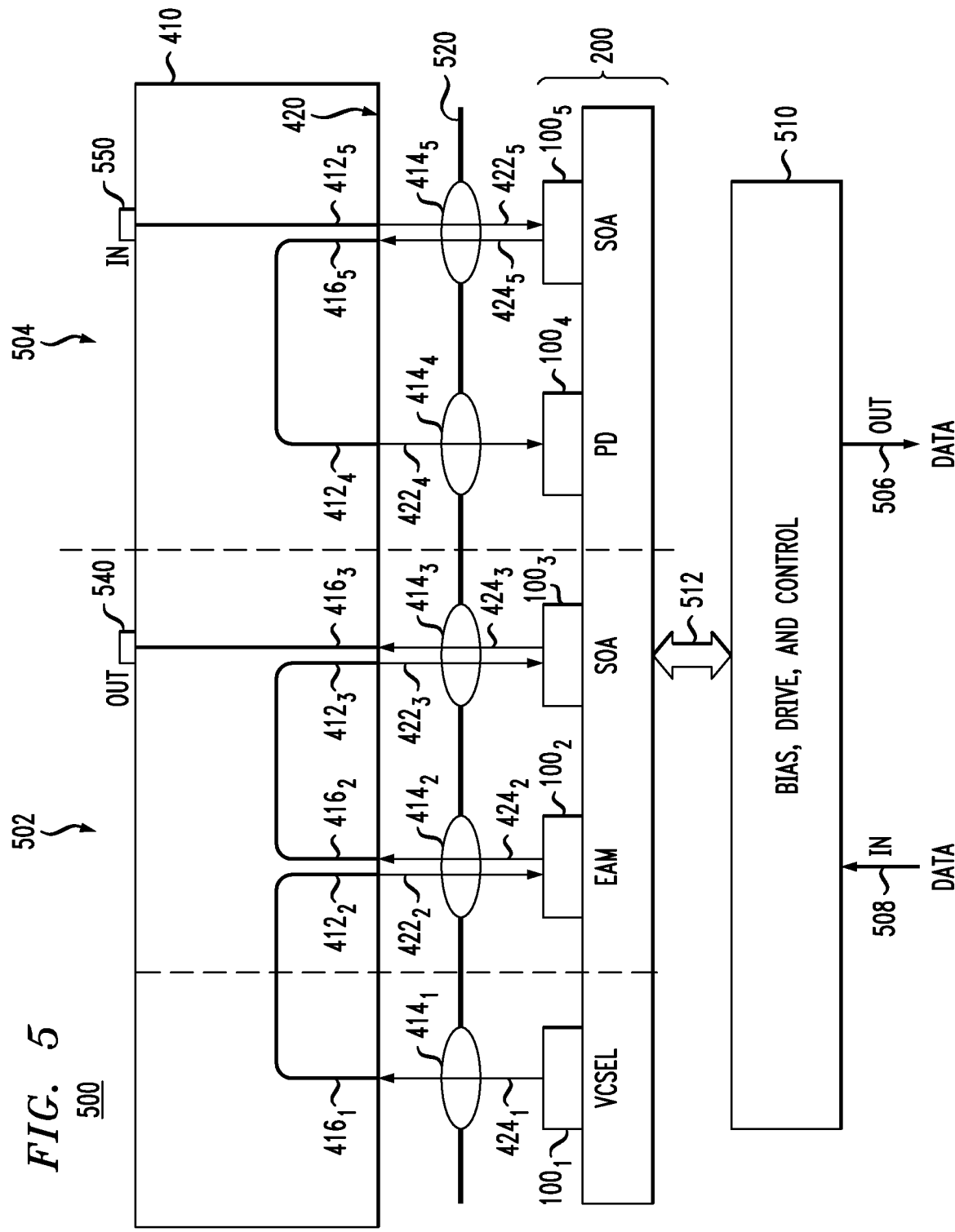
FIG. 5 shows a block diagram of an optical transceiver that includes an array of SCODs of FIG. 1 according to an embodiment.

FIG. 5 shows a block diagram of an optical transceiver 500 according to an embodiment. Transceiver 500 comprises: (i) an optical transmitter 502; (ii) an optical receiver 504; and (iii) an embodiment of SCOD array 200 (also see FIG. 2C) that includes SCODs $100_1$-$100_5$. SCODs $100_1$-$100_3$ are used to implement optical transmitter 502. SCODs $100_4$ and $100_5$ are used to implement optical receiver 504.

Transceiver 500 further comprises an embodiment of planar lightwave circuit 410 (also see FIG. 4), an array 520 of lenses $414_1$-$414_5$ (also see FIG. 4), and an electrical circuit 510 operatively connected to SCOD array 200 as indicated in FIG. 5.

Waveguide circuit 410 includes fiber connectors 540 and 550 to which external optical fibers can be connected. Connector 540 is configured to operate as an optical output port of transceiver 500. Connector 550 is configured to operate as an optical input port of transceiver 500.

Electrical circuit 510 is connected to SCOD array 200 using an electrical bus 512. In operation, circuit 510 can perform some or all of the following: (i) provide respective bias voltages to SCODs $100_1$-$100_5$; (ii) generate electrical RF drive signals to be applied to some of the SCODs (e.g., SCOD $100_2$) in response to an electrical analog data-input signal 508; and (iii) generate an electrical analog data-output signal 506 in response to the corresponding RF signal(s) received from some of the SCODs (e.g., SCOD $100_4$).

In the shown embodiment, SCODs $100_1$-$100_5$ are configured to operate as a VCSEL, an EAM, a SOA, a PD, and a SOA, respectively. These configurations can be obtained, e.g., as described above in reference to FIGS. 1 and 2.

Optical transmitter 502 can operate, for example, as follows.

SCOD $100_1$ generates an optical output beam $424_1$, which is then coupled, by way of lens $414_1$, into waveguide $416_1$ of circuit 410. Waveguide $416_1$ directs the received light to waveguide $412_2$, which outputs it as an optical output beam $422_2$. Lens $414_2$ couples beam $422_2$ into SCOD $100_2$, where it is modulated to generate a corresponding modulated optical output beam $424_2$. The modulation is performed using the electrical RF drive signal generated by circuit 510 in response to the data-input signal 508, with the drive signal being applied to SCOD $100_2$ by way of electrical bus 512. Lens $414_2$ couples beam $424_2$ into waveguide $416_2$ of circuit 410. Waveguide $416_2$ directs the received light to waveguide $412_3$, which outputs it as an optical output beam $422_3$. Lens $414_3$ couples beam $422_3$ into SCOD $100_3$, where it is amplified to generate a corresponding amplified optical output beam $424_3$. Lens $414_3$ then couples beam $424_3$ into waveguide $416_3$ of circuit 410. Finally, waveguide $416_3$ directs the received light to connector 540, where it can be coupled into the optical fiber connected thereto for transmission to a remote receiver (not explicitly shown in FIG. 5).

Optical receiver 504 can operate, for example, as follows.

Waveguide $412_5$ of circuit 410 receives, by way of connector 550 and the optical fiber connected thereto, an optical input signal received from a remote transmitter (not explicitly shown in FIG. 5). Waveguide $412_5$ then outputs the received light as an optical output beam $422_5$. Lens $414_5$ couples beam $422_5$ into SCOD $100_5$, where it is amplified to generate a corresponding amplified optical output beam $424_5$. Lens $414_5$ then couples beam $424_5$ into waveguide $416_5$ of circuit 410. Waveguide $416_5$ directs the received light to waveguide $412_4$, which outputs it as an optical output beam $422_4$. Lens $414_4$ couples beam $422_4$ into SCOD $100_4$, where it is converted into a corresponding electrical signal. This electrical signal is then directed by way of electrical bus 512 to circuit 510, where it is used to generate the data-output signal 506.

Various additional embodiments can be obtained, e.g., using one or more of the following modifications of transceiver 500.

SCOD $100_1$ can be removed, and waveguide $416_1$ can be connected to an external laser (not explicitly shown in FIG. 5).

SCOD $100_3$ can be removed, and waveguide $416_2$ can be connected to fiber connector 540 instead of waveguide $416_3$.

SCOD $100_5$ can be removed, and waveguide $412_4$ can be connected to fiber connector 550 instead of waveguide $412_5$.

A stand-alone optical receiver can be obtained by removing, disabling, or disconnecting transmitter 502.

A stand-alone optical transmitter can be obtained by removing, disabling, or disconnecting receiver 504.

In some embodiments, the embodiment of circuit 410 shown in FIG. 5 can be replaced by a functionally similar optical circuit constructed using a plurality of appropriately connected optical circulators 310.

According to an example embodiment disclosed above, e.g., in the summary section and/or in reference to any one or any combination of some or all of FIGS. 1-5, provided is an apparatus (e.g., 500, FIG. 5) comprising: a plurality of optical devices (e.g., $100_1$-$100_5$, FIG. 5) supported on a planar surface (e.g., 214, FIG. 2C), each of the optical devices being configured to receive light, emit light, or receive and emit light substantially (e.g., within ±10 degrees) orthogonally to the planar surface; wherein the plurality of optical devices include a first optical device and a second optical device; wherein the first optical device is configured to operate as an optical device of a first type; wherein the second optical device is configured to operate as an optical device of a second type different from the first type; and wherein the first type and the second type are selected from a device-type set consisting of a laser (e.g., VCSEL, FIG. 5), an optical amplifier (e.g., SOA, FIG. 5), a reflective optical modulator (e.g., EAM, FIG. 5), and a photodetector (e.g., PD, FIG. 5).

In some embodiments of the above apparatus, the plurality of optical devices include a third optical device configured to operate as an optical device of a third type different from the first type and the second type and selected from said device-type set.

In some embodiments of any of the above apparatus, the plurality of optical devices include a fourth optical device configured to operate as an optical device of a fourth type different from the first, second, and third types and selected from said device-type set.

In some embodiments of any of the above apparatus, the plurality of optical devices include a third optical device configured to operate as an optical device of the second type (e.g., SOA and SOA, FIG. 5).

In some embodiments of any of the above apparatus, each of the optical devices comprises a respective semiconductor diode (e.g., 110/112/118, FIG. 1) that includes a respective multiple-quantum-well structure (e.g., 112, FIG. 1).

In some embodiments of any of the above apparatus, each of the respective semiconductor diodes comprises a respective plurality of thin semiconductor layers (e.g., 110/112/114/116/118, FIG. 1) oriented substantially (e.g., within ±10 degrees) parallel to the planar surface.

In some embodiments of any of the above apparatus, the apparatus further comprises an electrical circuit (e.g., 510, FIG. 5) connected to electrically bias the respective semiconductor diodes.

In some embodiments of any of the above apparatus, the electrical circuit is configured to apply: a forward bias to the semiconductor diode of the first optical device; and a reverse bias to the semiconductor diode of the second optical device.

In some embodiments of any of the above apparatus, the apparatus further comprises a device carrier (e.g., 202, FIGS. 2C, 5) that comprises the planar surface, the device carrier being configured to electrically connect the optical devices to the electrical circuit.

In some embodiments of any of the above apparatus, each of the optical devices comprises a respective optical resonator bounded by a respective first optical reflector (e.g., 106, FIG. 1) and a respective second optical reflector (e.g., 130, FIG. 1), the first optical reflector being a nontransparent optical reflector and the second optical reflector being a partially transparent dielectric optical reflector.

In some embodiments of any of the above apparatus, the first and second optical devices have nominally identical first optical reflectors, each being a metal mirror.

In some embodiments of any of the above apparatus, the second optical reflector of the first optical device differs from the second optical reflector of the second optical device in at least one of: reflectivity, transmissivity, chemical composition, and thickness.

In some embodiments of any of the above apparatus, each of the respective optical resonators comprises a respective semiconductor diode (e.g., 110/112/118, FIG. 1) that includes a respective multiple-quantum-well structure (e.g., 112, FIG. 1).

In some embodiments of any of the above apparatus, the apparatus further comprises an optical circuit (e.g., 410, FIG. 5; or functional equivalent thereof constructed using 310, FIG. 3) configured to optically couple the first optical device and the second optical device such that light emitted by the first optical device is received by the second optical device.

In some embodiments of any of the above apparatus, the first optical device is configured to operate as a laser (e.g., $100_4$, FIG. 5); and wherein the second optical device is configured to operate as an optical modulator (e.g., $100_2$, FIG. 5).

In some embodiments of any of the above apparatus, the first optical device is configured to operate as an optical modulator (e.g., $100_2$, FIG. 5); and wherein the second optical device is configured to operate as an optical amplifier (e.g., $100_3$, FIG. 5).

In some embodiments of any of the above apparatus, the first optical device is configured to operate as an optical amplifier (e.g., $100_5$, FIG. 5); and wherein the second optical device is configured to operate as a photodetector (e.g., $100_4$, FIG. 5).

In some embodiments of any of the above apparatus, the optical circuit comprises a planar lightwave circuit (e.g., 410, FIGS. 4, 5).

In some embodiments of any of the above apparatus, the optical circuit comprises an optical circulator (e.g., 310, FIG. 3).

In some embodiments of any of the above apparatus, the apparatus further comprises an optical data transmitter (e.g., 502, FIG. 5) that includes the first and second optical devices.

In some embodiments of any of the above apparatus, the apparatus further comprises an optical data receiver (e.g., 504, FIG. 5) that includes the first and second optical devices.

In some embodiments of any of the above apparatus, the apparatus further comprises an optical data transceiver (e.g., 500, FIG. 5) that includes the first and second optical devices.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels (if any) in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the layers are horizontal but would be horizontal where the layers are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for peration." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure.

What is claimed is:

1. An apparatus, comprising a plurality of optical devices supported on a planar surface, each of the optical devices being configured to receive light, emit light, or receive and emit light substantially orthogonally to the planar surface;
   wherein the plurality of optical devices include a first optical device and a second optical device;
   wherein the first optical device is configured to operate as an optical device of a first type;
   wherein the second optical device is configured to operate as an optical device of a second type different from the first type;
   wherein the first type and the second type are selected from a device-type set consisting of a semiconductor optical amplifier, a reflective optical modulator, and a photodetector; and
   wherein at least one of the first and second optical devices comprises a respective optical resonator bounded by a respective first optical reflector and a respective second optical reflector, the first optical reflector being a high-reflectivity optical reflector and the second optical reflector being a partially transparent dielectric optical reflector.

2. The apparatus of claim 1, wherein the plurality of optical devices include a third optical device configured to operate as an optical device of a third type different from the first type and the second type and selected from said device-type set.

3. The apparatus of claim 1, wherein the plurality of optical devices include a third optical device configured to operate as an optical device of the second type.

4. The apparatus of claim 1, wherein each of the optical devices comprises a respective semiconductor diode that includes respective multiple quantum wells.

5. The apparatus of claim 4, wherein each of the respective semiconductor diodes comprises a respective plurality of thin semiconductor layers oriented substantially parallel to the planar surface.

6. The apparatus of claim 4, further comprising an electrical circuit connected to electrically bias the respective semiconductor diodes.

7. The apparatus of claim 6, wherein the electrical circuit is capable of applying:
   a forward bias to the semiconductor diode of the first optical device; and
   a reverse bias to the semiconductor diode of the second optical device.

8. The apparatus of claim 6, further comprising a device carrier that comprises the planar surface, the device carrier being configured to electrically connect the optical devices to the electrical circuit.

9. The apparatus of claim 1, wherein the first and second optical devices have nominally identical first optical reflectors, each comprising a reflective metal surface.

10. The apparatus of claim 1, wherein the second optical reflector of the first optical device differs from the second optical reflector of the second optical device in at least one of: reflectivity, transmissivity, chemical composition, and thickness.

11. The apparatus of claim 1, wherein each of the respective optical resonators comprises a respective semiconductor diode that includes respective multiple quantum wells.

12. The apparatus of claim 1, further comprising an optical circuit configured to optically couple the first optical device and the second optical device such that light emitted by the first optical device is received by the second optical device.

13. The apparatus of claim 12,
wherein the first optical device is configured to operate as a reflective optical modulator; and
wherein the second optical device is configured to operate as a semiconductor optical amplifier.

14. The apparatus of claim 12,
wherein the first optical device is configured to operate as a semiconductor optical amplifier; and
wherein the second optical device is configured to operate as a photodetector.

15. The apparatus of claim 1, further comprising an optical data transmitter that includes the first and second optical devices.

16. The apparatus of claim 1, further comprising an optical data receiver that includes the first and second optical devices.

17. The apparatus of claim 1, further comprising an optical data transceiver that includes the first and second optical devices.

18. The apparatus of claim 1, wherein the plurality of optical devices include a semiconductor optical amplifier and a reflective optical modulator.

19. The apparatus of claim 1, wherein the plurality of optical devices include a vertical-cavity surface-emitting laser.

20. The apparatus of claim 1, wherein each of the first and second optical devices comprises the respective optical resonator.

21. An apparatus, comprising a plurality of optical devices supported on a planar surface, each of the optical devices being configured to receive light, emit light, or receive and emit light substantially orthogonally to the planar surface;
wherein the plurality of optical devices include a first optical device and a second optical device;
wherein the first optical device is configured to operate as an optical device of a first type;
wherein the second optical device is configured to operate as an optical device of a second type different from the first type;
wherein the first type and the second type are selected from a device-type set consisting of a vertical-cavity surface-emitting laser, a semiconductor optical amplifier, a reflective optical modulator, and a photodetector;
wherein the plurality of optical devices include a third optical device configured to operate as an optical device of a third type different from the first type and the second type and selected from said device-type set; and
wherein the plurality of optical devices include a fourth optical device configured to operate as an optical device of a fourth type different from the first, second, and third types and selected from said device-type set.

22. An apparatus, comprising a plurality of optical devices supported on a planar surface, each of the optical devices being configured to receive light, emit light, or receive and emit light substantially orthogonally to the planar surface;
wherein the plurality of optical devices include a first optical device and a second optical device;
wherein the first optical device is configured to operate as an optical device of a first type;
wherein the second optical device is configured to operate as an optical device of a second type different from the first type;
wherein the first type and the second type are selected from a device-type set consisting of a vertical-cavity surface-emitting laser, a semiconductor optical amplifier, a reflective optical modulator, and a photodetector;
wherein each of the optical devices comprises a respective semiconductor diode that includes respective multiple quantum wells; and
wherein the apparatus further comprises an electrical circuit connected to electrically bias the respective semiconductor diodes.

23. The apparatus of claim 22, wherein the electrical circuit is capable of applying:
a forward bias to the semiconductor diode of the first optical device; and
a reverse bias to the semiconductor diode of the second optical device.

24. The apparatus of claim 22, further comprising a device carrier that comprises the planar surface, the device carrier being configured to electrically connect the optical devices to the electrical circuit.

25. The apparatus of claim 22, wherein at least one of the first and second optical devices is configured to operate as a reflective optical modulator.

26. The apparatus of claim 22,
wherein the first optical device is configured to operate as a reflective optical modulator; and
wherein the second optical device is configured to operate as a semiconductor optical amplifier.

27. The apparatus of claim 22,
wherein the first optical device is configured to operate as a vertical-cavity surface-emitting laser; and
wherein the second optical device is configured to operate as a reflective optical modulator.

* * * * *